United States Patent [19]

Shiiki et al.

[11] Patent Number: 4,795,671
[45] Date of Patent: Jan. 3, 1989

[54] PARA-PHENYLENE SULFIDE BLOCK COPOLYMERS, PROCESS FOR THE PRODUCTION OF THE SAME AND USE THEREOF

[75] Inventors: Zenya Shiiki; Takayuki Katto; Yo Iizuka; Takao Iwasaki; Toshitaka Kouyama, all of Iwaki, Japan

[73] Assignee: Kureha Kagaku Kogyo Kabushiki Kaishi, Tokyo, Japan

[21] Appl. No.: 133,905

[22] Filed: Dec. 16, 1987

Related U.S. Application Data

[60] Division of Ser. No. 858,851, Apr. 30, 1986, which is a continuation-in-part of Ser. No. 748,464, Jun. 25, 1985, abandoned.

[30] Foreign Application Priority Data

Jun. 29, 1984 [JP] Japan ................................ 59-134633
Aug. 27, 1984 [JP] Japan ................................ 59-178016
Aug. 27, 1984 [JP] Japan ................................ 59-178017

[51] Int. Cl.⁴ .............................................. B05D 1/00
[52] U.S. Cl. ..................................... 428/209; 264/104; 427/96; 428/208; 428/419; 428/901
[58] Field of Search ............... 428/209, 208, 419, 901; 264/104; 427/96

[56] References Cited

U.S. PATENT DOCUMENTS 4,568,603 2/1986 Oldham ............................. 428/209
4,595,623 6/1986 DuPont et al. ...................... 428/209

Primary Examiner—Morton Foelak
Attorney, Agent, or Firm—Wenderoth, Lind & Ponack

[57] ABSTRACT

A para-phenylene sulfide block copolymer consisting essentially of a recurring unit (A)

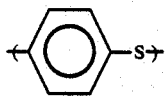

and a recurring unit (B)

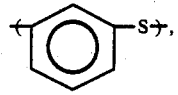

said recurring units (A) being present in the form of a block of 20 to 5,000 units of (A) on the average in the molecular chain, the mol fraction of the recurring units (A) being in the range of 0.50 to 0.98, the block copolymer having a melt viscosity ($\eta^*$) of 50 to 100,000 poise as determined at 310° C. at a shear rate of 200 sec$^{-1}$ and having: (a) a glass transition temperature (Tg) of 20° to 80° C., (b) a crystalline melting point (Tm) of 250° to 285° C., and (c) a crystallization index (Ci) of 15 to 45, this value being that of the heat-treated, but not stretch-oriented copolymer, which block copolymer is preferably produced by a process comprising a first step of heating an aprotic polar organic solvent containing a dihaloaromatic compound consisting essentially of a m-dihalobenzene and an alkali metal sulfide to form a reaction liquid (e) containing a m-phenylene sulfide polymer consisting essentially of recurring units (B)

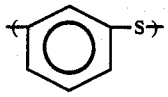

and a second step of adding a p-dihalobenzene to the reaction liquid (E) and heating the mixture in the presence of an alkali metal sulfide an an aprotic polar organic solvent to form a block copolymer consisting essentially of the recurring units (B) and recurring units (A)

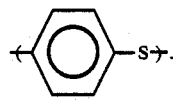

9 Claims, No Drawings

PARA-PHENYLENE SULFIDE BLOCK COPOLYMERS, PROCESS FOR THE PRODUCTION OF THE SAME AND USE THEREOF

This is a Rule 60 divisional application of Ser. No. 858,851, filed Apr. 30, 1986 which is a continuation-in-part of Ser. No. 748,464, filed June 25, 1985, now abandoned.

BACKGROUND OF THE INVENTION

1. Field of the Art

The present invention relates to a p-phenylene sulfide copolymer. More particularly, the invention relates to a crystalline p-phenylene sulfide block copolymer comprising a block of p-phenylene sulfide recurring units

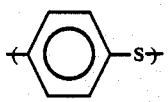

in the molecular chain.

2. Prior Art

Concerning p-phenylene sulfide polymers, there have been numerous reports on p-phenylene sulfide homopolymers (as disclosed in the specifications of Japanese Patent Publications Nos. 12240/1977 and 3368/1970 and Japanese Patent Laid-Open No. 22926/1984). Also, some reports can be found on p-phenylene sulfide random copolymers (as described, for example, in the specification of U.S. Pat. No. 3,869,434).

The p-phenylene sulfide homopolymers have been used as heat-resistant thermoplastic resins mainly in injection molding processes since the highly crystalline p-phenylene sulfide homopolymers can be used at a temperature as high as nearly their crystalline melting point (about 285° C.) when they are highly crystallized. However, these polymers have been accompanied by the problems of excessively high crystallization rate in the melt process and ready formation of rough spherulites. That is, when films are to be formed from them by an inflation method, they are crystallized and solidifed prior to sufficient inflation, whereby it is difficult to form intended stretched and oriented films. In extrusion molding by means of a T-die to form a sheet, the crystallization and solidifying occur prior to the winding of the sheet around a wind-up roll, whereby it is difficult to obtain a smooth sheet having a uniform thickness. In melt extrusion to form pipes, rough spherulites are formed prior to the quench to make it difficult to obtain the tough extrusion moldings. In melt coating of electric wires, rough spherulites are formed in the coating film to make it difficult to obtain tough coating films. In the production of fibers by melt spinning process, the crystallization and solidifying proceed in the course of the melt spinning operation to make sufficient stretch and orientation impossible, and, therefore, tough fibers cannot easily be obtained.

While the p-phenylene sulfide random copolymers, which are generally non-crystalline, have a characteristic feature of being melt-processed quite easily, since they are not crystallized or solidified in the course of the melt spinning operation, they are problematic in that their heat resistance is extremely poor due to the non-crystallizability.

Printed circuit boards composed of an insulating base and a metal layer of a circuit pattern formed on the surface thereof have been used widely in the field of electronic appliances.

As the insulating materials for the printed circuit boards, composites of thermosetting resins, such as epoxy, phenolic and unsaturated polyester resins, with fibrous reinforcing materials, such as glass fibers, synthetic fibers and paper, have been mainly used. However, these materials are problematic in that a long time is necessary for recovery of the solvent and curing of the resin and in that they have a high hygroscopicity and only a poor resistance to CAF (conductive anodic fiber growth).

Recently, attempts were made to use a composite of poly-p-phenylene sulfide which is a thermoplastic resin and a fibrous reinforcing material for the production of insulating bases for printed circuit boards (as described in the specifications of Japanese Patent Laid-Open Nos. 96588/1982 and 3991/1984). However, the insulating base comprising the poly-p-phenylene sulfide has insufficient adhesion to the metal layer, and, therefore, the metal layer is easily peeled off.

Electronic components such as IC, transistors, diodes and capacitors have been sealed with or encapsulated within a synthetic resin or ceramic substance for the purposes of preventing changes in the properties due to the external atmosphere, preventing deformation, and maintaining the electrical insulating property.

The sealing resins used heretofore include thermosetting resins, particularly, epoxy and silicone resins. However, these resins have the following defects: (1) the molding time is prolonged, since a long time is necessary for the thermosetting, (2) a long post-curing time is required, (3) as the molding shot number is increased, contamination of the mold accumulates, (4) the resin is easily deteriorated during storage and (5) unnecessary portions like runner gates of the moldings cannot be reused.

For overcoming the above mentioned drawbacks, processes wherein poly-p-phenylene sulfide (a thermoplastic resin) is used have been proposed (as described, for example, in the specifications of Japanese Patent Publication No. 2790/1981 and Japanese Patent Laid-Open Nos. 22363/1978, 81957/1981, 20910/1984 and 20911/1984).

When poly-p-phenylene sulfide is used, the sealing or encapsulation is conducted ordinarily by a melt molding process. In this process, the crystallization proceeds rapidly to form rough spherulites in the step of solidifying the molten resin. Therefore, a marked molding shrinkage occurs in the resin layer, particularly around the spherulites, to form cracks in the resin layer, to cut or to deform the bonding wire, and to form a gap between the lead frame or bonding wire and the resin layer. As a result, a problem arises in the resulting electronic parts in the water penetrates thereinto through the interface between the resin layer and the lead frame or bonding wire to cause deterioration of the quality of the electronic parts particularly at a high temperature in a highly humidity atmosphere. To solve these problems, processes wherein inorganic fillers or various additives are used have been proposed. However, the problems cannot be solved essentially unless the properties of the base resin are altered.

SUMMARY OF THE INVENTION

According to the present invention, the problems of excessively high crystallization rate and rough spherulite-forming property of the p-phenylene sulfide homopolymers and also non-crystallizability and poor heat resistance of the p-phenylene sulfide random copolymers are solved. The present invention provides a phenylene sulfide polymer having excellent crystallinity, heat resistance and easy melt-processability. That is, the present invention provides a crystalline phenylene sulfide polymer suitable particularly for the inflation film-forming process, melt extrusion molding, electric wire coating, melt spinning and stretching.

The phenylene sulfide polymer according to the present invention is a para-phenylene sulfide block copolymer consisting essentially of recurring units (A)

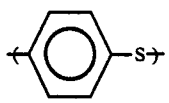

and recurring unit (B)

said recurring units (A) being present in the form of a block of 20 to 5,000 units thereof on the average in the molecular chain, characterized in that the mol fraction of the recurring units (A) is in the range of 0.50 to 0.98, and the copolymer has a melt viscosity ($\eta^*$) of 50 to 100,000 poise, which is hereinbelow indicated as P, as determined at 310° C. at a shear rate of 200 sec$^{-1}$ and physical properties which will be described hereinafter.

According to this invention in another aspect thereof, there is provided a process for producing the p-phenylene sulfide block copolymer described above which process comprises a first step of heating an aprotic polar organic solvent containing a p-dihalobenzene and an alkali metal sulfide to form a reaction liquid mixture (C) containing a p-phenylene sulfide polymer consisting essentially of recurring units (A)

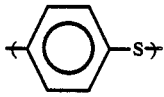

and a second step of adding a dihaloaromatic compound consisting essentially of a m-dihalobenzene to the reaction liquid mixture (C) and heating the mixture in the presence of an alkali metal sulfide and an aprotic polar organic solvent to form a block copolymer consisting essentially of a block consisting essentially of the recurring units (A) and a block consisting essentially of recurring units (B)

wherein: the reaction in the first step is carried out until the degree of polymerization of the recurring units (A) has become 20 to 5,000 on the average; the reaction in the second step is carried out until the mol fraction (X) of the recurring units (A) in the resulting block copolymer has become 0.50 to 0.98; and the reactions in these steps are carried out so that the resulting p-phenylene sulfide block copolymer will have a melt viscosity ($\eta^*$) measured under conditions of 310° C./200 sec$^{-1}$ of 50 to 100,000 P and physical properties which will be described hereinafter.

Another mode of practice of the process of the present invention for producing the p-phenylene sulfide block copolymer described above comprises a first step of heating an aprotic polar organic solvent containing a dihaloaromatic compound consisting essentially of a m-dihalobenzene and an alkali metal sulfide to form a reaction liquid mixture (E) containing a m-phenylene sulfide polymer consisting essentially of recurring units (B)

and a second step of adding a p-dihalobenzene to the reaction liquid (E) and heating the mixture in the presence of an alkali metal sulfide and an aprotic polar organic solvent to form a block copolymer consisting essentially of the recurring units (B) and recurring units (A)

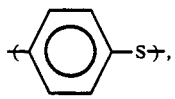

wherein: the reaction in the first step is carried out until the average degree of polymerization of at least 2 and in the range of $$\left(20 \times \frac{1-X}{X}\right) \text{ to } \left(5,000 \times \frac{1-X}{X}\right)$$

where X represents a mol fraction of the recurring units (A) in the resulting block copolymer which is in the range of 0.50 to 0.98 has been obtained; the reaction in the second step is carried out until the mol fraction (X) of the recurring units (A) in the resulting block copolymer has become 0.50 to 0.98; and the reactions in these steps are carried out so that the resulting p-phenylene sulfide block copolymer will have a melt viscosity ($\eta^*$) measured under conditions of 310° C./200 sec$^{-1}$ of 50 to 100,000 P and physical properties which will be described hereinafter.

Still another mode of practice of the process of the present invention for producing the p-phenylene sulfide block copolymer described above comprises a first step of heating an aprotic polar organic solvent containing a p-dihalobenzene and an alkali metal sulfide to form a reaction liquid (C) containing a p-phenylene sulfide polymer comprising recurring units (A)

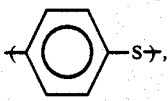

a second step of heating the aprotic polar solvent containing a dihaloaromatic compound consisting essentially of a m-dihalobenzene and an alkali metal sulfide to form a reaction liquid (D) containing a m-phenylene sulfide polymer consisting essentially of recurring units (B)

and a third step of mixing the reaction liquids (C) and (E) obtained as above and heating the mixture to form a p-phenylene sulfide block copolymer consisting essentially of blocks of said recurring units (A) and the recurring units (B), wherein: the reaction in the first step is carried out until the average degree of polymerization of 20 to 5,000 recurring units (A) on the average has been obtained; the reaction in the second step is carried out until the average degree of polymerization of at least 2 and in the range of $$\left(20 \times \frac{1-X}{X}\right) \text{ to } \left(5,000 \times \frac{1-X}{X}\right)$$

wherein X represents a mol fraction of the recurring units (A) in the resulting block copolymer which is in the range of 0.50 to 0.98 has been obtained; the reaction in the third step is carried out so that the mol fraction (X) of the recurring units (A) in the resulting block copolymer will be in the range of 0.50 to 0.98; and the reactions in these steps are carried out so that the resulting p-phenylene sulfide block copolymer will have a melt viscosity ($\eta^*$) measured under conditions of 310° C./200 sec$^{-1}$ of 50 to 100,000 P and physical properties which will be described hereinafter.

The above described p-phenylene sulfide block copolymer has the following physical properties:
(a) a glass transition temperature (Tg) of 20° to 80° C.,
(b) a crystalline melting point (Tm) of 200° to 350° C., and
(c) a crystallization index (Ci) of 15 to 45, this value being that of the heat-treated, but not stretch-oriented copolymer.

The present invention in still another aspect thereof also provides molded articles of the above described p-phenylene sulfide block copolymer.

The present invention further relates to the use of the block copolymer for the production of a printed circuit board.

The printed circuit board according to the present invention is composed of an insulating base which is a molded plate comprising a composite of 50 to 95 vol. % of a polymer comprising mainly a phenylene sulfide block copolymer and 5 to 50 vol. % of a fibrous reinforcing material and a metal layer of a circuit pattern formed on the surface of the base, said phenylene sulfide block copolymer comprising 20 to 5,000 recurring units

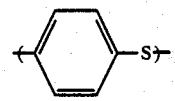

on the average in the molecular chain, said recurring units

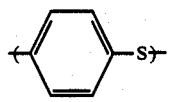

having a mol fraction of 0.50 to 0.98 and said copolymer having a melt viscosity ($\eta^*$) of 300 to 50,000 P as determined at 310° C. at a shear rate of 200 sec$^{-1}$ and a crystalline melting point of 200° to 350° C.

The present invention in a further aspect thereof provides methods of use of the above-mentioned block copolymer as a starting material for a composition for sealing or encapsulating electronic parts.

The composition of the invention for sealing electronic parts comprises 100 parts by weight of a synthetic resin component and 20 to 300 parts by weight of an inorganic filler, characterized in that the synthetic resin component comprises mainly a phenylene sulfide block copolymer consisting essentially of recurring units

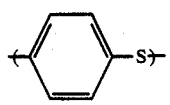

and recurring units

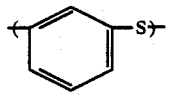

wherein the former recurring units form a block having an average degree of polymerization of 20 to 2000 bonded in the molecular chain and have a mol fraction in the range of 0.50 to 0.95, said copolymer having a melt viscosity of 10 to 1500 P as determined at 310° C. and at a shear rate of 200 sec$^{-1}$.

A process for sealing or encapsulating electronic parts is also presented according to the present invention, which process is characterized in that the electronic parts are sealed by an injection molding method with a sealing composition comprising 100 parts by weight of a synthetic resin component and 20 to 300 parts by weight of an inorganic filler wherein the synthetic resin component comprises mainly a phenylene sulfide block copolymer consisting essentially of recurring units

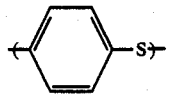

and recurring units

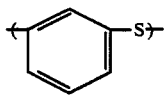

in which the former recurring units form a block having an average degree of polymerization of 20 to 2,000 bonded in the molecular chain and have a mol fraction in the range of 0.50 to 0.95, said copolymer having a melt viscosity of 10 to 1,500 P (310° C., shear rate: 200 sec$^{-1}$).

According to the block copolymers of the present invention, the problems of the melt processability of p-phenylene sulfide homopolymer can be solved while the crystallizability and heat resistance of the latter are maintained. The copolymers of the present invention have a great characteristic processability whereby they can well be molded in a temperature zone ranging from the crystalline melting point (Tm) to the crystallization temperature on the higher temperature side (Tc$_2$) (i.e., the temperature at which the crystallization begins as the temperature is lowered gradually from the molten state), i.e., in the supercooling region. Therefore, the copolymers of the invention are suitable for inflation molding, extrusion molding (production of sheets, pipes, profiles, etc.), melt spinning and electric wire coating. Other characteristic physical properties will be described below.

The phenylene sulfide block copolymers used as the base resin in the present invention are free of the afore-described problems of the phenylene sulfide homopolymer, while retaining substantially the desirable characteristics of the cyrstalline homopolymer. The copolymers have a high adhesion to metal layers.

Therefore, a printed circuit board comprising a plate formed by molding a composite of the phenylene sulfide block copolymer of the present invention (base resin) and a fibrous reinforcing material and a metal layer formed on the surface of the plate is advantageous in that the metal layer has good adhesion to the insulating base even when the layer is formed by an additive method and in that it has also excellent insulating properties and resistance to soldering heat. Thus, the printed circuit board can be used widely in the field of electronic devices and appliances.

The phenylene sulfide block copolymers used as the base resin in the present invention are free of the afore-described problems of the phenylene sulfide homopolymer, which retaining substantially the desirable characteristics of the crystalline homopolymer. Thus, these copolymers are suitable for sealing electronic components.

DETAILED DESCRIPTION OF THE INVENTION

Block Copolymers

Chemical structure of the copolymer

The crystalline p-phenylene sulfide block copolymer according to the present invention is a high molecular substance having such a chemical structure that the recurring units (A)

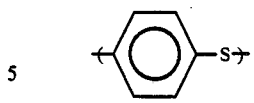

in the form of blocks are contained in the molecular chain.

According to our findings, it is necessary that the p-phenylene sulfide recurring units (A) be distributed in the moleculwar chain in the form of a block comprising 20 to 5,000, preferably 40 to 3,500, and particularly 100 to 2,000 units, on the average, so that the copolymer can be processed easily in the inflation film-forming, melt-extrusion molding, electric wire coating, melt spinning and stretching processes while high heat resistance due to the crystallinity of the p-phenylene sulfide homopolymer is maintained. Copolymers wherein the recurring units (A) are distributed at random or wherein a block comprising up to 20 recurring units (A) on the average are distributed are not preferred since the crystallinity as that of the p-phenylene sulfide homopolymer is lost completely or partially, and the heat resistance due to the crystallinity is lost. On the other hand, when the recurring units (A) are distributed in the form of blocks comprising more than 5,000 units (A) on the average, the resulting copolymer undesirably has substantially the same properties as those of the p-phenylene sulfide homopolymer.

It is necessary that the mol fraction X of the recurring units (A) in the blocks in the copolymer molecular chain be in the range of 0.50 to 0.98, preferably in the range of 0.60 to 0.90. When the mol fraction of the p-phenylene sulfide recurring units is controlled in this range, the resulting copolymer has excellent processability in the steps of inflation-film formation, melt extrusion, electric wire coating and melt spinning and drawing while retaining the excellent crystallinity and heat resistance peculiar to the p-phenylene sulfide homopolymer. When the mol fraction of the recurring units (A) exceeds 0.98, the effect of improving the processability becomes insufficient. On the other hand, when it is less than 0.5, the crystallinity is reduced, and, accordingly, the heat resistance is seriously reduced. The mol fraction can be controlled easily by varying the proportion of the starting materials used in the polymerization step.

The recurring units (B) which constitute the block copolymer of the present invention together with the p-phenylene sulfide recurring units (A) are arylene sulfide units ─Ar—S─ consisting essentially of m-phenylene sulfide recurring units

In this formula, Ar represents an aromatic compound residue. ─Ar-S─ units other than the m-phenylene sulfide recurring units include:

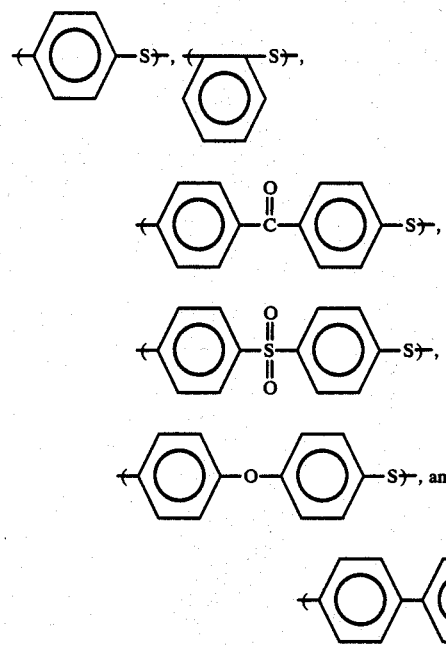

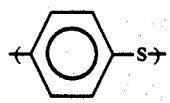

Two or more of these recurring units can be used together. The term "consisting essentially of m-phenylene sulfide units B" used herein indicates that the amount of m-phenylene sulfide units is at least 80 molar %, preferably 90 to 100 molar %, based on the total recurring units (B).

The degree of polymerization of the p-phenylene sulfide block copolymer according to the present invention represented in terms of melt viscosity $\eta^*$ is 50 to 100,000 P, preferably 1,000 to 50,000 P. The melt viscosity $\eta^*$ is determined by means of a Kōka-shiki flow tester at 310° C. and at a shear rate of 200 sec$^{-1}$. When the value of $\eta^*$ is less than 50 P, the intended tough molded article cannot be obtained, and when it exceeds 100,000 P, the molding operation becomes difficult.

The number of the recurring units (A)

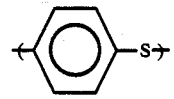

in the block copolymer according to the present invention, i.e., the degree of polymerization of the poly-p-phenylene sulfide block, can be determined by a fluorescent X-ray method. The degree of polymerization of the poly-m-phenylene sulfide block components (B) can be measured by gel permeation chromatography (GPC). The mol fraction (X) of the poly-p-phenylene sulfide block components can be determined easily by an infrared analysis.

Physical properties

The p-phenylene sulfide block copolymer of the present invention has a glass transition temperature (Tg) of 20° to 80° C., a crystalline melting point (Tm) of 200° to 350° C. and a crystallization index (Ci) of 15 to 45 (this value being of the heat treated, but non-stretched non-oriented copolymer sheet).

The block copolymer of the present invention has a Tg lower than that of the p-phenylene sulfide homopolymer. Therefore, this copolymer is advantageous in that the stretching temperature can be lowered and the processing can be conducted under conditions substantially the same as those employed in processing polyethylene terephthalate (PET), etc.

Although the Tg of the block copolymer of the present invention is lower than that of the homopolymer, this copolymer is characterized in that it is a crystalline polymer having a Tm close to the Tm of the homopolymer probably because the heat resistance of the polymer is governed by the

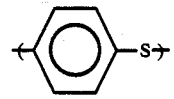

blocks. This is the most remarkable difference between the copolymer of the present invention and an ordinary p-phenylene sulfide copolymer (i.e., random copolymer), since the Tm of the latter disappears (i.e., the latter becomes amorphous) or it is greatly reduced. Thus, the heat resistance of the copolymer of the present invention can be maintained.

The difference between the upper limit Tc$_2$ of the crystallization temperature range (i.e., the temperature at which the crystallization is initiated as the temperature of the molten block copolymer is lowered) of the block copolymer of the present invention and the Tm thereof is quite large, and the crystallization rate is not very high, while Tc$_2$ of the p-phenylene sulfide homopolymer is very close to the Tm thereof and the crystallization rate of this homopolymer is quite high. These are important characteristic features of the block copolymer of the present invention. As described above, the block copolymer of the present invention is suitable for various processing processes since it can be amply molded even in the supercooling temperature range, i.e., the temperature range between Tm and Tc$_2$, while the homopolymer cannot be melt-processed easily in the inflation, extrusion molding or melt spinning process, since the Tc$_2$ thereof is very close to the Tm thereof, and its crystallization rate is quite high, whereby it is crystallized rapidly after the melt spinning.

The block copolymer of the present invention has a Tc$_2$ in the range of ordinarily 150° to 230° C. The lower limit Tc$_1$ of the crystallization temperature range (i.e., the temperature at which the crystallization is initiated as the temperature of the amorphous block copolymer is elevated) of the block copolymer of the present invention is ordinarily in the range of 100° to 150° C.

The values of Tm, Tg, Tc$_1$ and Tc$_2$ are values represented by the melting peak, the temperature at which the heat absorption is initiated, and the crystallization peak, respectively, as measured by using 10 mg of a sample by means of a differential scanning calorimeter (DSC) of Shimadzu Seisaku-sho at a temperature-elevation or -lowering rate of 10° C./min in a nitrogen atmosphere. This sample is in molten state to rapidly cooled, substantially amorphous state.

The degree of crystallinity of the block copolymer of the present invention is ample for maintaining the heat resistance due to the crystallization of the polymer though it does not exceed the degree of crystallinity of the p-phenylene sulfide polymer. Therefore, high heat resistance of the copolymer can be obtained by amply crystallizing the same according to heat setting. Further, the heat resistance can be improved by increasing the degree of crystallinity by carrying out stretch-orientation prior to the heat setting. Ordinary random copolymers have no crystallinity whatsoever or they have only a slight crystallinity, and, therefore, the effect of realizing heat resistance by heat setting cannot be expected. They have lost their property of heat resistance.

The crystallization index (Ci) of the heat-treated, but not stretch-oriented, block copolymer of the present invention is in the range of 15 to 45. The crystallization index Ci is a value obtained from an X-ray diffraction pattern ($2\theta = 17°–23°$) according to the formula:

$$Ci = [Ac/(Ac + Aa)] \times 100$$

wherein Ac represents crystalline scattering intensity and Aa represents amorphous scattering intensity [ref.: J. Appl. Poly. Sci. 20, 2545 (1976)]. The value Ci is determined in the present invention by melt-pressing the block copolymer at a temperature higher than its melting point by about 30° C. by means of a hot press, rapidly cooling the same with water to obtain a film having a thickness of 0.1 to 0.2 mm, heat-treating the film at a temperature lower than the melting point by 20° C. for 20 min. to effect the crystallization, and measuring the Ci of the thus heat-treated film. The heat-treated film has an increased Ci in the range of generally 40 to 90 after the stretch-orientation.

Since the homopolymer has an excessively high crystallization rate, and, accordingly, coarse spherulites are formed, rapid crystallization and solidifying occur after the melt molding, whereby stretch orientation thereof by ample expansion of the same by the inflation method is difficult. It is quite difficult to prepare a smooth, uniform sheet or film by a T-die method, to obtain highly stretchable filaments by a melt-spinning method, or to obtain tough extrusion-molded products or tough electric wire coatings from the homopolymer for the same reasons as described above.

On the other hand, when the block copolymer of the present invention is used, it is possible to obtain an amply expanded and stretch-oriented film or sheet by the inflation method, since said block copolymer has a suitable crystallization rate, and, therefore, the resulting spherulites are fine. Thus, it becomes possible to prepare a smooth, uniform sheet or film by a T-die method, to obtain tough moldings by an extrusion method, to obtain highly stretchable filaments by a melt-spinning process and to obtain a tough electric wire coating.

In this connection, it is very difficult to obtain a practically valuable, heat set film from a homopolymer having a melt viscosity $\eta^*$ of as low as 2,000 P, since it is partially whitened due to the coarse crystal formation in the heat setting. On the other hand, a practically valuable, uniform, heat set film can be obtained from the block polymer of the present invention since coarse spherulites are not easily formed. Because the formed spherulites are not easily made coarse, not only films but also other molded articles obtained from the block copolymer of the present invention have greatly advantageous physical properties, whereby they are not made brittle but keep their toughness even after the heat setting carried out for the purpose of imparting the heat resistance.

Production of Block Copolymer

Summary

The block copolymer of the present invention consists essentially of a block consisting essentially of p-phenylene sulfide recurring units (A) and a block consisting essentially of recurring units (B) consisting essentially of m-phenylene sulfide. This copolymer can be produced by any process capable of forming both blocks and bonding them.

More specifically, in one mode of the process, one of the blocks is formed, and the polymer chain is then extended by polymerization thereover of the monomer to form the other block whereby formation of the second block and bonding of the second block with the first block take place simultaneously.

The process for producing the block copolymer of the present invention is essentially the same as a conventional process for producing a phenylene sulfide polymer except that care is taken in the formation and bonding of the blocks and the varieties of the phenylene sulfide recurring units and that modifications are made if necessary in the former process. That is, the process of the present invention for producing the block polymer comprises heating an alkali metal sulfide and a dihaloaromatic compound (comprising mainly p- and m-dihalobenzenes) in an aprotic polar organic solvent to accomplish condensation (to remove the alkali metal halide).

Starting materials

The alkali metal sulfides which are the sources of the sulfide bond are preferably Na, Li, K and Rb sulfides. From the viewpoint of reactivity, Na and Li sulfides are particularly preferred. When they contain water of crystallization, the water content thereof can be reduced suitably by distillation or drying prior to the initiation of the polymerization reaction.

Preferred examples of the aprotic polar organic solvents used as the reaction medium are carboxylic acid amides, organic phosphoric acid amides, and urea derivatives. Among these, N-methylpyrrolidone, which is hereinbelow abbreviated as "NMP", hexatrimethylphosphoric acid triamide and tetramethylurea are particularly preferred from the viewpoints of chemical and thermal stabilities.

Among the dihaloaromatic compounds, examples of p-dihalobenzenes used for forming the p-phenylene sulfide blocks are p-dichlorobenzene and p-dibromobenzene. Preferred examples of the dihalo-substituted aromatic compounds usable in a small amount together with the m-dihalobenzene to form the other blocks include the following compounds, (but they are not limited to these compounds):

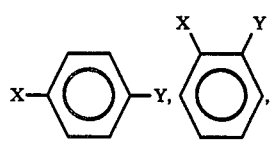

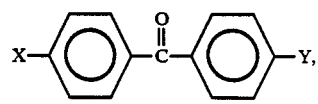

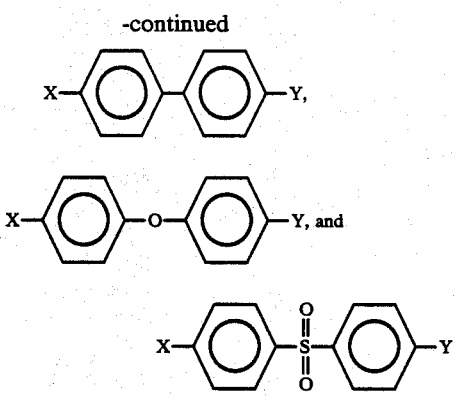

wherein X and Y each represent a halogen atom.

Further, polyfunctional compounds having 3 or more halogen atoms such as 1,2,3- or 1,2,4-trihalobenzenes can also be used.

As a matter of course, the polymerization conditions must be selected so as to obtain a polymer having a $\eta^*$ of 50 to 100,000 P, preferably 1,000 to 50,000 P.

Production process (I)

Production process (I) comprises forming blocks of the p-phenylene sulfide recurring units (A), and then forming recurring units consisting essentially of m-phenylene sulfide in situ with simultaneous bonding of it with the block (A).

When the starting alkali metal sulfide contains water of crystallization, that is, when the starting alkali metal sulfide is $Na_2S.9H_2O$, $Na_2S.5H_2O$ or $Na_2S.3H_2O$ (including a product of in situ reaction of $NaHS.2H_2O + NaOH \rightarrow Na_2S.3H_2O$), it is preferable to reduce the water content thereof suitably by drying before it is added to the organic solvent, to add the alkali metal sulfide alone to the organic solvent, and then to heat the mixture to about 200° C. to distill the water off or to chemically dehydrate the same by addition of CaO, etc. so as to control the water content suitably (ordinarily to 0.5 to 2.5 mol/mol of the sulfide). Then, p-dihalobenzene is added in such an amount that the molar ratio thereof to the sulfide will ordinarily be 0.95 to 1.05. The mixture is heated to a suitable temperature, preferably 160° to 300° C., particularly 190° to 260° C., to carry out the polymerization reaction until an average polymerization degree of the resulting p-phenylene sulfide prepolymer of 20 to 5,000 is obtained to obtain the reaction liquid mixture (C) containing the prepolymer.

The required time is generally about 0.5 to 30 hrs.

On the other hand, the starting alkali metal sulfide is dried and then charged into the organic solvent in the same manner as above, or, alternatively, the water content of the alkali metal sulfide is controlled by distillation in the organic solvent or by a chemical dehydration, and then a m-dihalobenzene (which can contain a small amount of a dihalo-substituted aromatic compound) is added thereto usually in such a amount that the molar ratio thereof to the sulfide would be 0.95/1 to 1.05/1 to obtain an unreacted liquid mixture (D).

The unreacted liquid mixture (D) is mixed with the reaction liquid mixture (C) containing the prepolymer in a given ratio (i.e., such a ratio that the mol fraction of the p-phenylene sulfide recurring units in the resulting block copolymer will be 0.50 to 0.98). If necessary, the water content of the mixture is controlled again, and the mixture is heated to a suitable temperature, preferably 160° to 300° C., particularly 200° to 280° C. to carry out the polymerization reaction. In this manner, the crystalline p-phenylene sulfide block copolymer of the present invention is obtained. If necessary, the polymer is neutralized, filtered, washed and dried to recover the same in the form of granules or a powder.

The latter step in the production process (I) is carried out for forming a block consisting essentially of units (B). An indispensable matter to be introduced in this step is a dihaloaromatic compound consisting essentially of a m-dihalobenzene. Therefore, the other starting material, i.e., the alkali metal sulfide, and the organic solvent for the block formation can be those used in the former step without necessitating fresh ones. In this case, the amount(s) of the alkali metal sulfide and/or organic solvent introduced in the former step is(are) increased, if necessary. As a matter of course, this mode is possible also in the following production process (II).

Production process (II)

The production process (II) is different from the process (I) in that the blocks of the recurring units (B) are formed first. The process II is preferable to the process (I) because the second step in II can be carried out with more ease than the second step in I since p-dihalobenzene polymerizes with more ease than m-dihalobenzene.

Particularly for obtaining block copolymers having a high molecular weight, the process (II) is the most effective among the three processes described above.

Generally, the following relationship is recognized:

$$n:m = X:(1 - X)$$

$$\therefore m = n \times \frac{(1 - X)}{X}$$

wherein: n represents an average length (degree of polymerization) of the block of p-phenylene sulfide recurring units (A); X represents a mol fraction; and m represents an average length of the block of recurring unit B consisting essentially of m-phenylene sulfide.

Therefore, in a block polymer in which n is 20 to 5,000, and m of the recurring unit (B) is in the range of $$20 \times \frac{(1 - X)}{X} \text{ to } 5{,}000 \times \frac{(1 - X)}{X}$$

with the proviso that m is not less than 2. The production process (II) has been developed on the basis of this relationship.

In this process, the polar organic solvent and the starting alkali metal sulfide having a controlled water content are charged into a reactor in the same manner as in process (I), the m-dihalobenzene (which can contain a small amount of a dihalo-substituted aromatic compound) is added thereto in such an amount that the molar ratio thereof to the sulfide will be 0.95/1 to 1.05/1, and the mixture is heated to a suitable temperature, particularly 160° to 300° C., preferably 190° to 260° C., to carry out the polymerization reaction until the average degree of polymerization of the resulting arylene sulfide prepolymer reaches $$20 \times \frac{(1 - X)}{X} \text{ to } 5{,}000 \times \frac{(1 - X)}{X}.$$

Thus, a reaction liquid mixture (E) containing the prepolymer is obtained.

On the other hand, the polar organic solvent and the starting alkali metal sulfide having a controlled water content are charged into a reactor in the same manner as in the process (I). A p-dihalobenzene is added thereto in such an amount that the molar ratio thereof to the sulfide will be 0.95/1 to 1.05/1 to obtain an unreacted liquid mixture (F). As described above, the essentially indispensable component of the mixture (F) is the p-dihalobenzene, and this mixture can be free of the sulfide and solvent.

The unreacted liquid mixture (F) is mixed with the prepolymer-containing reaction mixture (E) obtained as above in a specific ratio. If necessary, the water content of the resulting mixture is controlled again, and the mixture is heated to a suitable temperature, particularly 160° to 300° C., preferably 200° to 280° C., to carry out the polymerization reaction. Thus, the crystalline p-phenylene sulfide block copolymer of the present invention is obtained. The polymer may be recovered and purified in the same manner as in the process (I).

Production process (III)

In this process, the blocks are formed separately and are then combined together.

The liquid reaction mixture (C) obtained in the process (I) is mixed with the liquid reaction mixture (E) obtained in the process (II) in a given ratio. If necessary, the water content of the resulting mixture is controlled, and then the mixture is heated to a suitable temperature, particularly 160° to 300° C., preferably 200° to 280° C., to cary out the polymerization reaction. Thus, the crystalline p-phenylene sulfide block copolymer of the present invention is obtained. The polymer may be recovered and purified in the same manner as in the process (I).

Uses of the Block Copolymer

The block copolymer of the present invention is usable for the production of various molded articles preferably in the form of at least a monoaxially stretch-oriented product.

Films

The crystalline p-phenylene sulfide block copolymer of the present invention can be shaped into films or sheets by an inflation method or T-die method. The films or sheets obtained by the T-die method can be further stretched into oriented films by means of a tenter, etc.

The block copolymer of the present invention can be shaped directly into a biaxially oriented film by heating the same to a temperature of at least Tm to melt the same and then expanding it to a 5 to 500 times as area ratio at a resin temperature in the range of $Tc_2$ to 350° C. The stretch-oriented film can further be converted to a heat resistant, stretch-oriented film having an increased degree of crystallization by heat-treating (i.e., heat-setting) the same at a temperature in the range of $Tc_1$ to Tm while the contraction or elongation is limited to up to 20% or while the size is kept unchanged.

In the T-die film formation method, the block copolymer of the present invention is melted by heating it to a temperature of at least Tm, and the melt is extruded through a T-die while the resin temperature is held above $Tc_2$ and below 350° C., the extrusion product being cooled rapidly or gradually and wound to obtain a non-oriented sheet or film. This sheet or film can be stretched monoaxially or biaxially to 2 to 20 times the initial area by means of a tenter or the like at a temperature in the range of Tg to $Tc_1$.

These non-oriented sheets or films or stretch-oriented films can also be converted into a heat-resistant film having an increased degree of crystallization by heat-setting the same at a temperature in the range of $Tc_1$ to Tm while the contraction or elongation is limited to up to 20% or while the size is kept unchanged.

The films or sheets thus obtained from the crystalline p-phenylene sulfide block copolymer of the present invention have a Tm of 250° to 285° C., Tg of 20° to 80° C., Ci of 15 to 85, and thickness of 1 μm to 5 mm. The films heat set after the stretch orientation has a Ci of 40 to 85 and thickness of 1 μm to 2 mm.

Filaments

Stretched filaments can be produced from the crystalline p-phenylene sulfide block copolymer of the present invention by heating it to a temperature of Tm to 400° C., extruding the obtained melt through a nozzle, spinning the same at a resin temperature of $Tc_2$ to 350° C., and stretching the extrusion product to 2 to 20-folds at a temperature in the range of $Tc_1$ to Tm.

When the stretched filament is blended with carbon fibers, glass fibers or aramide fibers and the obtained blend is heated to a temperature higher than its melting point, a stampable sheet can be obtained. The stretched filament can be converted into a heat-resistant one having an increased degree of crystallization (Ci: 40 to 90) by heat-setting the same at a temperature in the range of $Tc_1$ to Tm while the contraction or elongation is limited to up to 20%, or while the size is kept unchanged.

Electric wire coating

Electric wires can be coated with the crystalline p-phenylene sulfide block copolymer of the present invention or a composition comprising this copolymer and an inorganic filler by heating the copolymer or the composition to a temperature in the range of Tm to 400° C. to melt the same and then coating the wire with the melt extruded through a crosshead die. When the stretch ratio in the first stretching is controlled to 50 to 500-folds and the temperature in the subsequent heat treatment is controlled in the range of $Tc_1$ to Tm to accomplish the heat setting, a tough, heat-resistant coated electric wire having a Ci of 15 to 70 can be obtained.

Extrusion-molded products

Tough, heat-resistant extrusion molded articles such as plates, pipes, rods and profiles having a Ci of 15 to 60 can be obtained from the crystalline p-phenylene sulfide block copolymer of the present invention or from a composition comprising the copolymer and a fibrous or powdery filler by heating the same to a temperature in the range of Tm to 400° C., extruding the obtained melt through a molding die, cooling the extrusion product rapidly or gradually and heat-treating the product at a temperature of $Tc_1$ to Tm.

Injection-molded products

Tough, heat-resistant moldings can be obtained from the crystalline p-phenylene sulfide block copolymer of the present invention or from a composition comprising the copolymer and a fibrous or powdery filler by heating the same to a temperature in the range of Tm to 400°

C., injecting the obtained melt into a mold and heat setting the product at a temperature in the range of $Tc_1$ to Tm. The block copolymer of the present invention is suitable particularly for the production of large molded articles and thick molded structures, since rough spherulites which cause cracks are not easily formed.

Compositions

The crystalline p-phenylene sulfide block copolymer of the present invention can also be melt-mixed with a powdery inorganic filler such as mica, $TiO_2$, $SiO_2$, $Al_2O_3$, $CaCO_3$, carbon black, talc, $CaSiO_3$ or $MgCO_3$ or with a fibrous filler such as glass, carbon, graphite or aramide fiber to form a composition. This copolymer can be blended also with, for example, a poly-p-phenylene sulfide, poly-m-phenylene sulfide, polyphenylene sulfide random copolymer, polyimide, polyamide, polyether ether ketone, polysulfone, polyether sulfone, polyetherimide, polyarylene, polyphenylene ether, polycarbonate, polyethylene terephthalate, polybutylene terephthalate, polyacetal, polypropylene, polyethylene, ABS, polyvinyl chloride, polymethyl methacrylate, polystyrene, polyvinylidene fluoride, polytetrafluoroethylene or tetrafluoroethylene copolymer to form a composition.

The crystalline p-phenylene sulfide block copolymer of the present invention can be converted into a high molecular ion complex by reacting the same with an alkali metal or alkaline earth metal hydroxide, oxide or alkoxide (including phenoxide) at a temperature of 200° to 400° C. (reference: specification of Japanese Patent Application No. 95705/1984).

Secondary uses

The heat-resistant films and sheets obtained from the crystalline p-phenylene sulfide block copolymer of the present invention or a composition thereof are useful as starting materials for printed circuit boards, magnetic tapes (both coated type and vapor-deposited type), insulating tapes and floppy discs in the electronic and electric technical fields. The extrusion-molded products (such as plates, pipes and profiles) are useful as printed circuit boards and protective tubes for wire assemblies in the electronic and electric art and as anti-corrosive, heat-resistant pipes and tubes in the technical field of chemical industry. Electric wires coated with these materials are useful as heat-resistant, anticorrosive electric wires. The injection-molded products are useful as IC-sealing materials, printed circuit boards, connectors and parts for microwave machineries in the electronic and electric field and as large-sized pumps, large-sized valves, sealing materials and lining materials in the chemical industry.

Printed Circuit Boards

One of the secondary uses of these films and sheets is the use of the above-mentioned block copolymer as a resin component for printed circuit boards.

Printed circuit boards according to the present invention are as defined above.

Block copolymer

The mol fraction of the recurring units

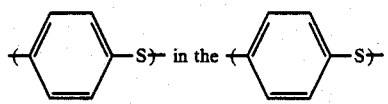

blocks in the molecular chain is in the range of 0.50 to 0.98, preferably 0.60 to 0.90. By controlling the mol fraction within this range, the crystallinity can be maintained while the excellent adhesion between the base and the metal is retained.

The block copolymer of the present invention has a melt viscosity ($\eta^*$) of 300 to 50,000 P, particularly preferably 300 to 30,000 P, as determined at 310° C. at a shear rate of 200 sec$^{-1}$. When the copolymer has a melt viscosity of less than 300 P (i.e., a low molecular weight), its strength is insufficient for the production of the printed circuit boards. When the melt viscosity exceeds 50,000 P, molding becomes difficult. The block copolymer of the present invention has a crystalline melting point (Tm) preferably in the range of 200° to 350° C. When the crystalline melting point is less than 200° C., the heat resistance is insufficient for printed circuit boards, and when it exceeds 350° C., molding operation becomes difficult.

The number of the recurring units

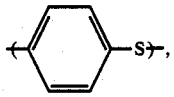

i.e., the degree of polymerization of the polyphenylene sulfide block component, is determined according to a fluorescent X-ray method. The mol fraction can be determined easily according to infrared analysis. The crystallization temperature is a value represented by a melting peak as determined by using 10 mg of the sample at a rate of 10° C./min. by means of a differential scanning calorimeter.

The base resin for the printed circuit boards according to the present invention is a polymer comprising mainly the phenylene sulfide block copolymer. The term "comprising mainly" herein indicates that the amount of the phenylene sulfide block copolymer is predominant.

Fibrous reinforcing materials

The fibrous reinforcing materials used in the present invention includes synthetic inorganic fibers (such as glass fibers, silica fibers, alumina fibers and ceramic fibers), excluding electroconductive ones such as metals and carbonaceous fibers; natural inorganic fibers (such as rock wool); synthetic organic fibers (such as aromatic amide fibers, phenol fibers and cellulose fibers); and natural organic fibers (such as pulps and cotton). From the viewpoints of electrical insulation properties, heat resistance, strength and economy, synthetic inorganic fibers, particularly glass fibers, are preferred.

The fibrous reinforcing materials may be in the form of any of short fibers, long fibers, papers, mats, felts and knits as long as they have an aspect ratio (fiber length/fiber diameter) of at least 10. In the production of the printed circuit boards by the injection molding method, short fibers are particularly preferred, in general. When the extrusion molding or compression molding method is employed, the form of the fibers is not limited. When the inorganic fibers are used as fibrous reinforcing material and an improvement of the wettability thereof with the phenylene sulfide block copolymer (base resin) is desired, treatment of the surface with a silane coupling agent (such as epoxysilane or mercaptosilane) is effective. It is also possible to use commercially available, surface-treated inorganic fibers.

The amount of the fibrous reinforcing material is determined suitably so that the amounts of the phenylene sulfide block copolymer and the fibrous reinforcing material will be 50–95 vol. % and 5–50 vol. %, respectively, based on the total volume thereof (their volumes can be easily determined by actual measurement or calculation based on the relationship between weight and specific gravity). When the amount of the fibrous reinforcing material is less than the above indicated value, adequate effect thereof cannot be obtained. On the other hand, when it exceeds the indicated upper limit, the properties of the phenylene sulfide block copolymer cannot be exhibited satisfactorily.

The phenylene sulfide block copolymer used as the base resin according to the present invention may contain, in addition to the fibrous reinforcing material, a small amount of a filler (such as calcium carbonate, titanium oxide, silica or alumina), anti-oxidant, stabilizer, lubricant, crystallization nucleating agent, colorant, releasing agent and other resins provided their effects are not counter to the objects of the invention.

Metal Layer

For the metal layer to be formed on the printed circuit board of the present invention, a thin layer of copper, aluminum, silver, gold layer or the like can be used. Of these, a copper or aluminum layer is representative.

Preparation of Printed Circuit Board

Molding of Base Material

The process for molding the composite of the phenylene sulfide block copolymer and the fibrous reinforcing material of the present invention into the plates is not particularly limited.

In the injection molding process, the plates can be molded by injecting a blend of the phenylene sulfide block copolymer, and the fibrous reinforcing material into a mold by means of an injection molding machine. When a specially designed mold is used, moldings having through holes can be prepared directly. This process is advantageous in that a subsequent hole-forming step is unnecessary. When a metal foil having a punched pattern is inserted, the printed-circuit board can be obtained directly. By this process the number of steps in the production of the printed circuit board can be reduced remarkably.

In one mode of production of a plate by extrusion molding process, a blend or laminate comprising the fibrous reinforcing material and the phenylene sulfide block copolymer is introduced between a pair of metal belts to carry out continuous compression, heating, and melting. If a metal foil is placed on one or both surfaces thereof, plate having a metal layer can be obtained directly.

In one mode of production of a plate by the compression molding process, a blend or laminate comprising the phenylene sulfide block copolymer and the fibrous reinforcing material is charged into a mold and subjected to compression, heating and melting to obtain the plate. If a metal foil is placed on one or both surfaces thereof, a plate having metal layer(s) can be obtained directly also in this case.

Production of printed circuit boards

In the production of printed circuit boards by forming a metal layer of a circuit pattern on an insulating board obtained by molding a composite of the phenylene sulfide block copolymer of the present invention and the fibrous reinforcing material, the production process is not particularly limited.

For example, a so-called subtractive method which comprises bonding a metal foil to a board (this operation may be omitted when the metal foil is applied in the course of the preparation of the board), and removing unnecessary parts of the metal foil by etching to form a circuit pattern can be used. When a board having no metal foil layer, particularly a board obtained by the injection molding method, is used, a so-called additive method wherein a circuit pattern is formed by a metal plating in necessary parts on the board or a so-called stamping foil method wherein a metal foil having a previously stamped pattern is applied thereto can be adopted.

The bonding of the metal foil to the board comprising a composite of the phenylene sulfide block copolymer of the present invention and the fibrous reinforcing material can also be accomplished by means of an adhesive (such as nitrile rubber, epoxy or urethane adhesive) after the production of the board by molding. In another process, the metal foil is bonded to the board by melt-contact-bonding in the course of the molding of the board or after the molding without using any adhesive.

Further, the circuit pattern can also be formed directly by metal plating. When a plating process is employed, the surface of the board is pretreated by a physical or chemical method such as mechanical abrasion or treatment with an organic solvent (such as a carboxylic acid amide, ether, ketone, ester, aromatic hydrocarbon, halogenated hydrocarbon, urea derivative or sulfolane), an oxidizing agent (such as chromic acid, permanganic acid or nitric acid), or a solution of a Lewis acid (such as $AlCl_3$, $TiB_4$, $SbF_5$, $SnCl_4$ or $BF_3$) so as to make the surface rough. By this treatment, the adhesion between the metal layer and the insulating board can be increased. This effect is further improved by incorporating a fine powder of calcium carbonate or titanium oxide in the starting materials for the board. The adhesion between the metal and the board comprising the phenylene sulfide copolymer base resin of the present invention can be improved by this pretreatment since the surface of the board is roughened suitably because of the characteristic properties of the block copolymer, while such an adhesion-improving effect cannot be obtained by the same pretreatment in a board comprising an ordinary poly-p-phenylene sulfide base resin. This is one of the important characteristic features of the insulating base.

Sealing or Encapsulation Compositions

Another secondary use of the block copolymer is the use thereof as a sealing or encapsulation composition comprising this block copolymer as a resin component.

The sealing composition of the present invention and the sealing process with the use thereof are as follows.

Block copolymers

The presence of the blocks comprising

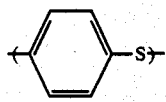

assures the crystallinity of the copolymer and heat resistance thereof owing to the crystallinity. The presence of the recurring units

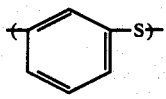

causes (1) a lowering of the melt viscosity of the copolymer to remarkably improve the injection moldability thereof, (2) prevention of the formation of spherulites to prevent crack formation or cutting or deformation of bonding wires, and (3) improvement of the adhesion to the lead frame or the bonding wire to greatly improve high-temperature moisture resistance of particularly the sealed electronic parts. Thus, by the introduction of the recurring units

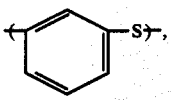

the defects of the p-phenylene sulfide homopolymer can be overcome.

The average degree of polymerization of the

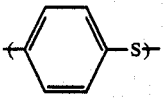

blocks in the block copolymer of the present invention is in the range of 20 to 2,000, preferably 40 to 1,000. With an average degree of polymerization less than 20, the crystallinity of the polymer is insufficient, and the molded articles obtained therefrom would have insufficient heat resistance. When the average degree of polymerization exceeds 2,000, the molecular weight of the copolymer is excessive, and properties thereof are like those of the p-phenylene sulfide homopolymer. As a result, molded articles having cracks, broken bonding wire, or poor high-temperature moisture resistance are unfavorably formed.

The melt viscosity, which is an index of the molecular weight, of the phenylene sulfide block copolymer of the present invention is suitably in the range of 10 to 1,500 P (at 310° C. and a shear rate of 200 $sec^{-1}$), particularly 50 to 800 P. When the melt viscosity is less than 10 P, the molecular weight is too low to obtain molded articles of a high strength. When it is as high as higher than 1,500 P, bonding wire is broken in the injection molding step or an insufficient filling is unfavorably caused.

The sealing composition of the present invention may contain, in addition to the phenylene sulfide block copolymer (main resin component), a small amount of other thermoplastic resins (such as poly-m-phenylene sulfide, poly-p-phenylene sulfide, m-phenylene sulfide/p-phenylene sulfide random copolymer, polybutyrene terephthalate, polyethylene terephthalate, poly- ether sulfone and polyamide) and thermosetting resins (such as epoxy resin, silicone resin and urethane resin) provided that the characteristic features of the composition are not impaired. The amount of the main resin component, i.e., phenylene sulfide block copolymer, is at least 60 wt. % based on the total resin. A preferred minor resin component is poly-m-phenylene sulfide or poly-p-phenylene sulfide.

Fillers

The inorganic fillers which can be contained in the sealing composition of the present invention include fibrous fillers, non-fibrous fillers, and combinations thereof.

Examples of non-fibrous fillers are quartz powder, glass powder, glass beads, alumina powder, $TiO_2$ powder, iron oxide powder, talc, clay and mica. The particle size of these fillers is preferably up to 0.5 mm since larger particles unfavorably cause the breaking of bonding wires.

Examples of fibrous fillers are glass fibers, silica fibers, wollastonite, potassium titanate fibers, processed mineral fibers and ceramic fibers. Those having a fiber length of up to 0.5 mm and an aspect ratio of at least 5 are preferred. Fibers longer than 0.5 mm cause breakage of bonding wire, and those having an aspect ratio of less than 5 unfavorably have insufficient reinforcing effect.

When an inorganic filler is mixed into the sealing composition of the present invention, the amount thereof is preferably 20 to 300 wt.%, particularly 50 to 200 wt.%. With more than 300 wt.%, the melt viscosity of the composition becomes excessive, and breakage of bonding wire is caused. A content less than 20% of the inorganic filler is undesirable because the thermal expansion coefficient becomes high to cause breakage of bonding wire.

In the case where an inorganic filler is mixed into the sealing composition of the present invention, the inorganic filler can be made hydrophobic by treating the same with a surface-treating agent such as a silane coupling agent or titanate coupling agent so as to improve the adhesion of the filler with the resin or to reduce its hygroscopicity. Alternatively, these treating agents can also be mixed into the sealing composition. Further, a water-repellent such as a modified silicone oil, fluorine oil or paraffin can be mixed into the sealing composition so as to increase the moistureproofness of the composition. Further, assistants such as a lubricant, colorant, releasing agent, heat stabilizer and curing agent may be added into the sealing composition of the present invention provided that they are not counter to the objects of the invention.

Sealing or Encapsulation of Electronic Parts

After mixing the synthetic resin component, inorganic filler and, if necessary, other additives, the resulting composition is used for sealing electronic parts.

The sealing may be conducted by a known process such as injection molding or transfer molding process. The molding is conducted with an ordinary injection-molding machine or transfer-molding machine under the conditions of a molding pressure of 10 to 200 kg/cm$^2$, cylinder temperature of 280° to 370° C. and mold temperature of 80° to 220° C.

A characteristic feature of the present invention, which is that the resin component is a block copolymer having improved crystallinity, can be exhibited most effectively when the sealing is carried out by injection molding of the resin composition.

EXPERIMENTAL EXAMPLES

Copolymers and Production Thereof

Synthesis Example A-1

11.0 kg of NMP (N-methylpyrrolidone) and 20.0 mol of Na$_2$S.5H$_2$O were placed in a 20-liter polymerization pressure vessel. The mixture was heated to about 200° C. to distill off water. (The loss of S due to the discharge in the form of H$_2$S was 1.4 molar % based on charged Na$_2$S, and the amount of water remaining in the vessel was 27 mol.) Then 20.1 mol of p-DCB (p-dichlorobenzene) and 3.1 kg of NMP were added thereto. After replacement of air with N$_2$, polymerization reaction was carried out at 210° C. for 4 hours. 53 mol of water was added to the mixture, and the reaction was continued at 250° C. for 0.5 hour to obtain a reaction liquid mixture (C-1), which was taken out and stored. A small amount of the mixture (C-1) was sampled to determine the degree of polymerization of the resulting p-phenylene sulfide prepolymer by fluorescent X-ray method. The degree of polymerization was 320.

11.0 kg of NMP and 20.0 mol of Na$_2$S.5H$_2$O were charged in a 20-liter polymerization pressure vessel. The mixture was heated to about 200° C. to distill off water (loss of S: 1.5 molar %, amount of water remaining in the vessel: 29 mol). Then, 20.1 mol of m-DCB (m-dichlorobenzene) and 3.0 kg of NMP were added thereto. The mixture was cooled under stirring to obtain an unreacted liquid mixture (D-1), which was taken out and stored.

The liquid reaction liquid mixture (C-1), unreacted liquid mixture (D-1), and water were placed in a 1-liter polymerization pressure vessel in proportions of 375 g/88 g/4.6 g, 328 g/131.5 g/6.9 g, and 234 g/219 g/11.5 g and they were reacted at 250° C. for 20 hours. After completion of the reactions, the respective liquid reaction mixtures were filtered, washed with hot water, and dried under reduced pressure to obtain block copolymers (1-1), (1-2), and (1-3).

Each block copolymer thus obtained was melted at a temperature higher than its melting point by about 30° C. and pressed with a hot press. The block copolymer was cooled rapidly with water to obtain a film having a thickness of 0.1 to 0.2 mm. The copolymer composition of this sample was determined according to an infrared analysis (FT-IR method). Tg, Tm, Tc$_1$ and Tc$_2$ of this sample were also measured.

Each film was heat-treated at a temperature lower than its melting point by 20° C. for 20 min. to obtain a heat-treated, crystallized sheet. The crystallization index Ci of the sheet was measured by X-ray diffraction method.

The results are summarized in Table A-1.

Synthesis Example A-2

11.0 Kg of NMP and 20.0 mol of Na$_2$S.5H$_2$O were placed in a 20-liter polymerization pressure vessel. The mixture was heated to about 200° C. to distill off water (loss of S: 1.5 molar %, and amount of water remaining in the vessel: 28 mol). Then, 20.1 mol of m-DCB and 3.0 kg of NMP were added thereto. After replacement of air with N$_2$, the polymerization reaction was carried out at 210° C. for 8 hours. 52 mol of water was added to the mixture and the reaction was continued at 250° C. for 0.5 hour to obtain a reaction liquid mixture (E-2), which was taken out and stored.

A small amount of the liquid (E-2) was sampled to determine the degree of polymerization of the resulting m-phenylene sulfide prepolymer by the GPC method. The degree of polymerization was 60.

11.0 kg of NMP and 20.0 mol of Na$_2$S.5H$_2$O were placed in a 20-liter polymerization pressure vessel. The mixture was heated to about 200° C. to distill off water (loss of S: 15 molar %, amount of water remaining in the vessel: 26 mol). Then, 20.2 mol of p-DCB and 3.0 kg of NMP were added thereto. The mixture was cooled under stirring to obtain an unreacted liquid mixture (F-2), which was taken out and stored.

The liquid reaction liquid mixture (E-2), unreacted liquid mixture (F-2) and water were placed in a 1-liter polymerization pressure vessel in proportions of 97 g/350 g/19.4 g, 140.5 g/306 g/17 g and 234 g/218.5 g/12.2 g and were reacted at 250° C. for 20 hours. After completion of the reactions, the respective liquid reaction mixtures were filtered, washed with hot water and dried under reduced pressure to obtain block copolymers (2-1), (2-2) and (2-3).

The mol fractions (X) of the recurring units The mole fraction (X) of recurring units

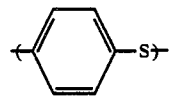

in the blocks were determined by infrared analysis and found to be 0.86, 0.79, and 0.68, respectively. The degree of polymerization of

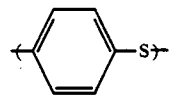

was calculated from the value of X according to the formula:

$$60 \times \frac{X}{1-X}.$$

The results are shown in Table A-1 together with the physical properties.

Synthesis Example A-3

The liquid reaction mixtures (C-1) and (E-2) obtained in Synthesis Examples A-1 and A-2 were placed in the reactor in amounts of 422 g/47 g, 375 g/94 g, 328 g/140.5 g and 234 g/234 g and were reacted at 250° C. for 20 hours. After completion of the reactions, the reaction mixtures were filtered, washed with hot water, and dried under reduced pressure to obtain block copolymers (3-1), (3-2), (3-3), and (3-4).

The physical properties thereof were as shown in Table A-1.

Synthesis Example A-3

A liquid reaction mixture (C-3) containing p-phenylene sulfide prepolymer was produced as in Synthesis Example A-1 except that the polymerization was carried at 210° C. for 3 hours in a 20-liter polymerization pressure vessel. Further, an unreacted liquid mixture (D-3) containing m-DCB was produced in the same manner as in Synthesis Example A-1 in a 20-liter polymerization pressure vessel.

7,170 g of the liquid (C-3), 1,190 g of the liquid (D-3) and 60 g of water were placed in a 10-liter polymerization pressure vessel, and reaction thereof was carried out at 255° C. for 15 hours. After completion of the reaction, a block polymer was recovered from the reaction liquid in the same manner as in Synthesis Example A-1. The polymerization was carried out in the same manner as above in 4 batches. The polymers obtained in total of 5 batches were blended together homogeneously and then shaped into polymer pellets (3-1) with a pelletizer. The p-phenylene sulfide prepolymer had an average degree of polymerization of 260.

A liquid reaction mixture (E-3) containing m-phenylene sulfide prepolymer was obtained as in Synthesis Example 2 except that the polymerization reaction was carried out at 210° C. for 6 hours in a 20-liter polymerization pressure vessel. An unreacted liquid mixture (F-3) containing p-DCB was obtained in the same manner as in Synthesis Example A-2 in a 20-liter polymerization pressure vessel.

7,170 g of the liquid (F-3), 1190 g of the liquid (E-3) and 60 g of water were placed in a 10-liter polymerization pressure vessel, and reaction was carried out at 255° C. for 15 hours. After completion of the reaction, a block copolymer was recovered from the reaction liquid in the same manner as in Synthesis Example A-1. The polymerization was repeated in 5 batches in the same manner as above. The polymers obtained in the total of 6 batches were blended together homogeneously and then shaped into polymer pellets (3-2) with a pelletizer. The m-phenylene sulfide prepolymer had an average degree of polymerization of 50.

Comparative Synthesis Example A-1

500 g of NMP and 1.00 mol of $Na_2S.3H_2O$ were placed in a 1-liter polymerization pressure vessel. The mixture was heated to about 200° C. to distill off water (loss of S: 1.6 molar %, amount of water remaining in the vessel: 1.4 mol). Then, 0.867 mol of p-DCB, 0.153 mol of m-DCB and 150 g of NMP were added thereto. After replacement of air with $N_2$, polymerization reaction was carried out at 210° C. for 5 hours. 2.6 mol of water was added, and the polymerization reaction was continued at 250° C. for 20 hours. After completion of the reaction, a random copolymer (comp. 1) was recovered from the reaction liquid in the same manner as in Synthesis Example 1. The properties of the resulting random copolymer were examined in the same manner as in Synthesis Example A-1 to obtain the results shown in Table A-1.

Comparative Synthesis Example A-2

625 g of NMP and 1.00 mol of $Na_2S.3H_2O$ were placed in a 1-liter polymerization pressure vessel. The mixture was heated to about 200° C. to distill off water (loss of S: 1.5 molar %, amount of water remaining in the vessel: 1.4 mol). Then, 1.01 mol of p-DCB and 155 g of NMP were added thereto. After replacement of air with $N_2$, polymerization reaction was carried out at 200° C. for 2.5 hours. After completion of the reaction, the resulting liquid reaction liquid mixture (C-Comp. 1) was taken out and stored. The resulting p-phenylene sulfide prepolymer had a degree of polymerization of up to 5.

400 g of the reaction liquid mixture (C-Comp. 1), 66 g of the unreacted liquid mixture (D-1) obtained in Synthesis Example A-1 and 3.5 g of water were placed in a 1-liter polymerization pressure vessel. The reaction was further carried out at 250° C. for 20 hours. After completion of the reaction, a block polymer (Comp. 2) was recovered from the reaction liquid in the same manner as in Synthesis Example A-1. The properties of this product were examined in the same manner as above to obtain the results shown in Table A-1.

Comparative Synthesis Example A-3

11.0 kg of NMP and 20.0 mol of $Na_2S.5H_2O$ were placed in a 20-liter polymerization pressure vessel. The mixture was heated to about 200° C. to distill off water (loss of S: 1.4 molar %, amount of water remaining in the vessel: 28 mol). Then, 20.1 mol of p-DCB and 3.1 kg of NMP were added thereto. After replacement of air with $N_2$, polymerization reaction was carried out at 210° C. for 5 hours. 52 mol of water was added thereto, and the polymerization reaction was continued at 250° C. for 10 hours. After completion of the reaction, a p-phenylene sulfide homopolymer was recovered from the reaction liquid in the same manner as in Synthesis Example A-1. The polymerization was carried out in the same manner as above in 3 batches. The polymers obtained in the total of 4 batches were blended together and then shaped into polymer pellets (Comp. 3) with a pelletizer. The properties of the thus obtained homopolymer were examined in the same manner as in Synthesis Example A-1 to obtain the results shown in Table A-1.

Synthesis Example A-5

Except that the post polymerization temperature was 260° C. and the duration was 12 hrs, preparation of a block copolymer was carried out in the same manner with the case of preparing polymer (1-1), and a block copolymer (5-1) was obtained. Except that post polymerization temperature was 260° C. and the duration was 8 hrs, preparation of a block copolymer was made in the same manner with the case of preparing polymer (2-1), and a block copolymer (5-2) was obtained. Except that post polymerization temperature was 260° C. and the duration was 8 hrs, preparation of a block copolymer was made in the same manner with the case of preparing polymer (3-2), and a block copolymer (5-3) was obtained. The recurring unit ratio

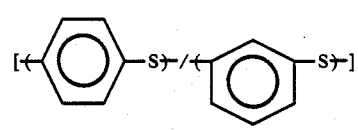

of the block copolymers of (5-1), (5-2) and (5-3) was 83/17, 84/16 and 82/18 (basic mole/basic mole), respectively, and the melt viscosity was 2100, 3500 and 100 P, respectively. Among these block copolymer, polymer (5-2) had the highest melt viscosity, although the total polymerization duration was all the same in each case (16.5 hrs).

TABLE A1

| Synthesis Example No. | Polymer code | Polymerization process | Polymer Composition recurring unit | Polymer Composition basic molar % ratio | Length of a block of unit A | $\eta^*$ | Tg | Tm | Tc$_1$ | Tc$_2$ | Ci | Remarks |
|---|---|---|---|---|---|---|---|---|---|---|---|---|
| Example A-1 | 1-1 | (I) | *²PP/MP*³ | = 84/16 | 320 | 1500 | 76 | 280 | 135 | 193 | 33 | crystalline |
| " | 1-2 | " | PP/MP | = 77/23 | 320 | 1700 | 72 | 275 | 145 | 175 | 36 | " |
| " | 1-3 | " | PP/MP | = 63/37 | 320 | 600 | 59 | 265 | 143 | 166 | 29 | " |
| Example A-2 | 2-1 | (II) | PP/MP | = 86/14 | 370*¹ | 2200 | 75 | 275 | 140 | 190 | 35 | " |
| " | 2-2 | " | PP/MP | = 79/21 | 225*¹ | 2000 | 74 | 275 | 140 | 180 | 30 | " |
| " | 2-3 | " | PP/MP | = 68/32 | 130*¹ | 700 | 62 | 260 | 148 | 170 | 27 | " |
| Example A-3 | 3-1 | (III) | PP/MP | = 81/19 | 320 | 2100 | 78 | 281 | 134 | 203 | 34 | " |
| " | 3-2 | " | PP/MP | = 82/18 | 320 | 2300 | 76 | 280 | 137 | 196 | 35 | " |
| " | 3-3 | " | PP/MP | = 75/25 | 320 | 2500 | 72 | 273 | 145 | 173 | 30 | " |
| " | 3-4 | " | PP/MP | = 61/39 | 320 | 800 | 61 | 260 | 135 | 165 | 26 | " |
| Example A-3 | 3-1 | (I) | PP/MP | = 88/12 | 260 | 1000 | 77 | 281 | 125 | 205 | 37 | " |
| " | 3-2 | (II) | PP/MP | = 87/13 | 340*¹ | 2500 | 73 | 275 | 139 | 200 | 32 | " |
| Comparative Example A-1 | Comp. 1 | — | PP/MP | = 86/14 | — | 300 | — | — | — | — | 0 | amorphous |
| Comparative Example A-2 | Comp. 2 | (I) | PP/MP | = 88/12 | <5 | 1500 | — | — | — | — | ≈0 | " |
| Comparative Example A-3 | Comp. 3 | — | PP/MP | = 100/0 | — | 6200 | 90 | 285 | 131 | 237 | 38 | crystalline |

*¹value calculated from the formula: n = m X/(1 − X)

*²PP: 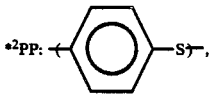

*³ 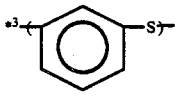

Molding Example A-1

The polymer pellets (3-1), (3-2) and (Comp. 3) obtained in Synthesis Example A-3 and Synthesis Comparative Example A-3 were melted by heating to a temperature above their melting points in a 35 mm $\phi$ extruder provided with a circle die (diameter of opening: 30 mm, clearance: 1 mm). The molten resins were supercooled to 220° to 250° C. in the die and airing part and expanded by stretching 6–8-folds in the machine directions to form inflated films. The average thicknesses of the biaxially oriented films obtained from the polymer pellets (3-1), (3-2), and (Comp. 3) were 20, 20, and 45 μm, respectively.

The inflated films were heat-treated at 260° C. for 10 minutes while the sizes thereof were kept constant. The films obtained from the polymers (4-1) and (4-2) could be heat-set uniformly and were biaxially oriented films having a high transparency, high degree of crystallization and smooth surface. On the other hand, the film obtained from the polymer (Comp. 3) was opaque and had a wavy surface, since whitening and wrinkling were caused in the course of the heat treatment. This phenomenon of the polymer (Comp. 3) was considered to be due to a rapid crystallization which occurred in the inflation step, and which inhibited ample expansion and orientation. The heat set films obtained from the polymers (3-1) and (3-2) had crystallization indexes of 68 and 65, respectively.

A part of the pellets obtained from each of the polymers (3-1), (3-2) and (Comp. 3) was hot-pressed at 310° C. and rapidly cooled to form an amorphous film having a thickness of about 0.2 mm. It was then stretched 3.0×3.0 fold by a biaxial stretching machine of T. M. Long Co. at 87° C., 87° C. and 103° C. to obtain stretched films. This film was heat-treated at 260° C. for 10 minutes to obtain a heat-set film having a high transparency. These heat-set films had thicknesses of 10, 8, and 9 μm, respectively, Ci of 75, 73, and 80, respectively, crystal sizes [determined from the diffraction peaks (2, 0, 0) obtained by the X-ray diffraction method according to a Schelle's formula] of 71, 78, and 75 Å, respectively, and coefficients of heat contraction of 12, 17, and 13%, respectively.

Molding Example A-2

Non-stretched monofilaments were produced from the pellets of each of the polymers (3-1), (3-2) and (Comp. 3) by winding at a rate of 4 m/min. at 320° C. on the average (take-off ratio $\bar{R}_1 = 10$) through a nozzle having a diameter of 1 mm and a length of 5 mm by using a melt tensiontester. The non-stretched monofilaments were immersed in an oil bath at 85° C., 85° C., and 95° C. and stretched with a jig to examine their stretchabilities. The non-stretched filaments obtained from the polymers (3-1) and (3-2) had a break rate of less than 10% even after stretching 8-fold, while those obtained from the polymer (Comp. 3) had a break rate of higher than 90% after stretching 8-fold probably because crystallization had proceeded in the spinning step. The average tensile moduli of elasticity and average elongations of the fibers which were not broken by the 8-fold stretching (30 to 90 μm) were 530, 500 and 590 (kg/mm²), respectively, and 100, 120 and 60%, respectively.

These fibers were heat-treated at 230° C. for 1 second to accomplish heat setting, while the elongation was limited to 3%. The average tensile moduli of elasticity and average elongations of the heat-set filaments were 800, 740, and 960 kg/mm², respectively, and 33, 35, and 18%, respectively.

Molding Example A-3

Copper wires having a diameter of 1 mm were melt-coated with pellets obtained from the polymer (3-1) and (Comp. 3) by means of a small-sized extruder (19 mm$\phi$ provided with an electric wire-coating die tip. The extruder head temperature was 310° C., and the die tip temperature was 270° C. In the melt-coating step, the polymer was stretched to a primary stretching ratio of 140 to 160, immersed in a glycerol bath (140° to 160° C.) and then in an infrared heating bath to heat-treat the same until the surface temperature of the coated wires reached about 160° to 180° C. Thus, the crystallization was accomplished. Ci were 31 and 41, respectively. The enameled wire-type coated wires thus obtained were subjected to an adhesion test (9.2 torsion test) and dielectric breakdown voltage resistance test (11.1.2. single strand method) according to JIS C 3003 (test methods for enameled copper wires and enameled aluminum wires). The results were as follows:

average coating film thickness: 35 and 40 μm
adhesion test: 100–120 times and 80–90 times
dielectric breakdown voltage resistance: >20 (KV/0.1 mm) and ≈15 (KV/0.1 mm).

Molding Example A-4

The polymer (3-2) was melted by heating in a 19 mmφ extruder provided with a die having a ring-shaped opening of a diameter of 10 mm and a clearance of 1 mm. The molten resin was supercooled to 220° to 250° C. in the die and the opening and extruded into the form of a tube, which was cooled in a water shower and cut. The obtained tube pieces were heat treated at 130° C. for 1 hour, at 150° C. for 1 hour and at 220° C. for 10 hours to bring about crystallization. The heat-treated tubes had a Ci of 28.

Molding Example A-5

The polymer (3-2), glass fiber (length: 2 cm, strands) and mica were melt-mixed in a 19 mmφ extruder to form pellets containing 50 wt. % of the glass fibers and 10 wt.% of mica. The pellets were injection-molded in an injection-molding machine provided with a mold measuring 1.5 mm × 8 cm × 10 cm at 320° C. to obtain a plate having a thickness of 1.5 mm. The plate was heat-treated at 250° C. for 4 hours. Ci was 30. The non-heat-treated plate thus obtained was interposed between sheets of copper foil (of a thickness of 35 μm) which has been surface-treated with a zinc/copper alloy. After pressing with a hot press at 320° C. for 10 minutes, a copper-coated plate was obtained. This product was heat-treated at 260° C. for 10 minutes. Ci was 26. The peeling strength of the copper foil was 1.9 kg/cm.

Molding Example A-6

The polymer (3-2) was mixed with 1 wt. % of NaOMe. The mixture was melted by heating to 330° C. in a 19-mm diameter extruder and extruded while it was reacted to obtain an ion complex. The product had a melt viscosity of 8,800 P as determined at 310° C. at a shear rate of 200 sec$^{-1}$. It was pressed at 310° C. to obtain a rapidly cooled sheet having a thickness of about 1.5 mm. This product was interposed between sheets of copper foil (of a thickness of 35 μm) which had been surface-treated with a zinc/copper alloy. After passing with a hot press at 310° C. for 5 minutes, a copper-coated plate was obtained. This product was heat-treated at 260° C. for 10 minutes. The peeling strength was 2.1 kg/cm.

Printed Circuit Boards

Synthesis Example B (1) 10 kg of N-methylpyrrolidone and 20.0 mol of Na$_2$S.5H$_2$O were placed in a 20-liter polymerization pressure vessel. The mixture was heated to about 200° C. to distill off water (loss of S: 1.4 molar %, amount of water in the vessel: 30 mol). Then, 20 mol of p-dichlorobenzene and 4 kg of N-methylpyrrolidone were added thereto. Polymerization reaction was carried out at 210° C. for 5 hours to obtain a reaction liquid mixture (A), which was taken out and stored.

Separately, 10 kg of N-methylpyrrolidone and 20.0 mol of Na$_2$S.5H$_2$O were placed in a 20-liter polymerization pressure vessel. The mixture was heated to about 200° C. to distill off water (loss of S: 1.4 molar %, amount of water present in the vessel: 28 mol). Then, 20.1 mol of m-dichlorobenzene and 4 kg of N-methylpyrrolidone were added thereto, and the mixture was stirred uniformly to obtain an unreacted liquid mixture (B), which was taken out and stored.

A small amount of the reaction liquid mixture (A) was sampled to determine the degree of polymerization of the resulting p-phenylene sulfide prepolymer by the fluorescent X-ray method and GPC method. The degree of polymerization was 290.

13,280 g of the reaction liquid mixture A, 2,720 g of unreacted liquid mixture B, 8 g of 1,3,5-trichlorobenzene and 800 g of water were charged in a 20-liter polymerization pressure vessel and were reacted at 250° C. for 19 hours to obtain a polymer. The polymerization was repeated in the same manner as above in 5 batches. The polymers obtained in the total of 6 batches were blended together homogeneously to obtain a polymer A. The polymer A had a melt viscosity of 2,600 P as determined at 310° C. at a shear rate of 200 sec$^{-1}$, degree of polymerization of the

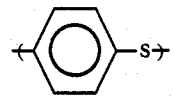

block of 290, mol fraction of

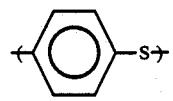

units of 0.86, and crystal melting point of 280° C.

(2) Reaction liquid mixture (A) and (B) were prepared in the same manner as above. 12,000 g of the liquid (A), 4,000 g of the liquid (B), 8 g of 1,2,4-trichlorobenzene and 400 g of water were charged into a 20-liter polymerization pressure vessel. The reaction was further carried out at 255° C. for 15 hours to obtain a polymer. Polymerization was repeated in the same manner as above in 5 batches. The polymers obtained as described above were blended together homogeneously to obtain a polymer B. The polymer B had a melt viscosity of 2,100 P, degree of polymerization of the

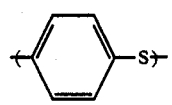

block of 290, mol fraction of

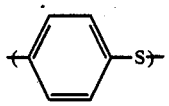

units of 0.79 and crystal melting point of 275° C.

(3) A p-phenylene sulfide homopolymer to be used in a comparative example was produced by a process disclosed in the specification of Japanese Patent Application No. 164,691/1983. In this process, 15 liter of N-methylpyrrolidone, 7.0 mol of water and 30 g of p-dichlorobenzene were charged into a 20-liter pressure autoclave. Then, an anhydrous glass-state ion complex ($S^{2-}$/$Na^+$/$Mg^{2+}$/$OH^-$=1/1/2/2) was added thereto in an amount of 30.0 g-equivalent in terms of $S^{2-}$ in the ion complex. After replacement of air with $N_2$, the mixture was stirred at about 100° C. for 1 hour to obtain a homogeneous dispersion. Then, polymerization reaction was carried out at 205° C. for 32 hours. The solvent was removed, and the polymer was washed in the ordinary manner to obtain a p-phenylene sulfide homopolymer. The polymerization was repeated in the same manner as above in 5 batches. The polymers thus obtained were blended together homogeneously to obtain a polymer X. The polymer X had a melt viscosity of 2,300 P and crystal melting point of 286° C.

Example B-1

The polymer A finely divided in a jet pulverizer was applied uniformly on a glass chopped strand mat (MC 450 A-010 of Nittobo Co., Japan; untreated). The mat was formed into a laminate comprising 4 mat layers. A copper foil (thickness: 35μ) the surface of which had been treated with a zinc/copper alloy was placed thereon. The laminate was passed between endless metal belts and heated to 320° to 330° C. under pressure in a heating zone. Then the thus treated laminate was cooled and taken off at about 120° to obtain a plate having a thickness of 1.6 mm and a glass fiber content of 45 vol.%. A part of the product was cut off and treated by an ordinary subtractive method to obtain a printed circuit board (1A).

Example B-2

The polymer A or X finely divided in a jet pulverizer was blended with a silane-treated glass chop strand having a fiber length of 6 mm (CS 6 PE-401; a product of Nittobo Co., Ltd.) and titanium oxide powder having a particle diameter of 0.4 μm (Tipaque R-820; a product of Isihara Sangyo Co., Ltd., Japan) in such amounts that a glass content of 30 vol. % would be obtained. The blend was fed into a flat plate mold, pressed at 325° C. under 2 kg/cm² and cooled rapidly to obtain a plate having a thickness of about 1.6 mm. A copper foil surface-treated with a zinc/copper alloy was applied to the top and bottom inner surfaces of the mold, and the plate was interposed between the sheets of a foil and was pressed at 325° C. under 8 kg/cm² and then at 180° C. under 40 kg/cm² to obtain a copper-coated plate. A part of the product was cut off and treated by an ordinary substractive method to obtain a printed circuit board plate 2A or 2X.

Example B-3

Three sheets of glass roving cloth cut into the same size (WR 570 C-100 of Nittobo Co., Ltd., Japan; treated with a silane) were fed into a flat plate mold. A mixture of the polymer B with the polymer X in a ratio of 3:1 was finely pulverized in a jet pulverizer and placed uniformly between the sheets and between the sheets of the mold. The laminate was pressed at 325° C. under 4 kg/cm² and cooled with water to obtain a plate having a thickness of 1.6 mm and a glass fiber content of 42 vol. %. Two sheets of a copper foil (35μ) which has been surface-treated with a zinc/copper alloy punched in a circuit pattern were applied to the top and bottom inner surfaces of the mold, and the plate obtained as described above was interposed between the foils. After stamping at 320° C. under 8 kg/cm² followed by pressing at 180° C. under 40 kg/cm² for 30 minutes, a printed circuit board 3BX was obtained.

Example B-4

Each of the polymer B and X, finely pulverized with a jet pulverizer was blended with glass chop strands having a length of 6 mm (CS 6 PE-401; a product of Nittobo Co., Ltd., Japan) and calcium carbonate having a particle diameter of 0.5μ (Super Flex of Pfizer Kyzley Co., Ltd.) in a mixer in such amounts that a glass content of 40 vol. % and a clacium carbonate content of 2 vol. % would be obtained. The mixture was shaped into pellets with a pelletizer, and the pellets were fed into an injection-molding machine. After the injection molding at a mold temperature of 180° C. and a cylinder temperature of 330° C., a plate having a size of 1.6 mm×100 mm×100 mm was obtained. An adhesive solution [i.e., a solution of 20% of NBR (Nipol #1041; a product of Nippon Zeon Co., Ltd., 4% of phenolic resin (Vercam TD #2645) of Dai-Nippon Ink Kagaku Co., Ltd.) and 16% of an epoxy resin (Epikote #1001 of Shell Chemical Co., Ltd.) in methyl ethyl ketone] was applied to a copper foil (35μ) which has been surface-treated with a zinc/copper alloy and punched in a circuit pattern. The thus treated copper foil was pressed onto the plates of the polymer B and X at 120° C. After curing at 170° C. for 1 hour, printed circuit boards 4B-1 and 4X-1 were obtained.

Separately, the plates of the polymer B and X were surface-treated with a W solution[*1] at 80° C. for 30 minutes, then X aqueous solution[*2] at room temperature for 3 minutes, Y aqueous solution[*3] at room temperature for 5 minutes and Z aqueous solution[*4] at 70° C. for 90 minutes to accomplish chemical copper plating. Thus, copper-plated boards 4B-2 and 4X-2 having a copper layer thickness of 9μ on the average were obtained.

(1*) W solution: 5% solution of $AlCl_3$ in toluene.
(2*) X aqueous solution: 30 g/liter of $SnCl_2.2H_2O$ and 15 ml/liter of HCl.
(3*) Y aqueous solution: 0.4 g/liter of $PdCl_2$, 15 g/liter of $SnCl_2$ and 180 ml/liter of HCl.
(4*) Z aqueous solution: 0.03 m/liter of $CuSO_4$, 0.23M/liter of NaOH, 0.10M/liter of HCHO, 0.04M/liter of EDTA and 50 mg/liter of 2,9-dimethyl-1,10-phenanthroline.

A copper foil (suface-treated with a zinc/copper alloy) punched in a circuit pattern was placed in the mold, and then each of the blends of the polymers B and X was injected to carry out molding. Thus, printed circuit boards 4B-3 and 4X-3 were obtained.

The printed circuit boards thus obtained were subjected to a soldering heat resistance test (in which the sample was immersed in a solder bath at 260° C. for 30 minutes, and the appearance thereof was examined) and a metal foil-peeling test (JIS C 6481).

The results are shown in Table B-1.

TABLE B1

| Printed Circuit Board No. | Volume % of Fiber | Soldering Heat Resistance | Peeling Strength (kg/cm) | Remarks |
|---|---|---|---|---|
| 1A | 45 | normal | 2.0 | |
| 2A | 30 | " | 1.9 | |
| 2X | 30 | " | 1.0 | Comp. Example |
| 3BX | 42 | " | 1.8 | |
| 4B-1 | 40 | " | 1.9 | |
| 4X-1 | 40 | " | 0.9 | Comp. Example |
| 4B-2 | 40 | " | 1.6 | |
| 4X-2 | 40 | " | 0.2 | Comp. Example |
| 4B-3 | 40 | " | 2.0 | |
| 4X-3 | 40 | " | 1.2 | Comp. Example |

Sealing Agents

Synthesis Example C (1) 11.0 kg of NMP (N-methylpyrrolidone) and 20.0 mol of Na$_2$S.5H$_2$O were charged into a 20-liter polymerization pressure vessel. The mixture was heated to about 200° C. to distill off water and a small amount of water remaining in the vessel: 26 mol). A solution of 20.1 mol of p-dichlorobenzene in 3.0 kg of NMP was added thereto, and the mixture was heated at 215° C. for 3 hours. Then, 54 mol of water was added thereto, and the mixture was heated at 255° C. for 0.5 hour to obtain a reaction liquid mixture a, which was taken out and stored. A small amount of the liquid a was sampled to determine the average degree of polymerization of the resulting p-phenylene sulfide prepolymer by the fluorescent X-ray method. The degree of polymerization was 190.

2.2 kg of NMP and 4.0 mol of Na$_2$S.5H$_2$O was charged into a 20-liter polymerization pressure vessel. The mixture was heated to about 200° C. to distill water and a small amount of NMP (the amount of water remaining in the vessel: 5.5 mol). A solution of 4.0 mol of m-dichlorobenzene in 0.6 kg of NMP was added thereto to obtain a mixture. 80% of the reaction liquid mixture a obtained as described above and 21.0 mol of water were added to the mixture. The mixture was stirred, and reaction was carried out at 255° C. for 2 hours. After completion of the reaction, the reaction liquid was diluted about 2 times in volume with NMP and filtered. The filter cake was washed with hot water 4 times and dried at 80° C. under reduced pressure to obtain a polymer A [p-phenylene sulfide block copolymer in which the average degree of polymerization of the

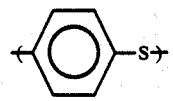

block was 190].

The composition of the polymer A was analyzed by the FT-IR method to reveal that it comprised 82 molar % of the

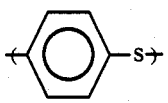

units and 18 molar % of the

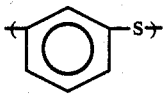

units. The product had a melt viscosity $\eta^*$ of 690 P as determined at 310° C. at a shear rate of 200 sec$^{-1}$, $T_G$ of 73° C. and $T_m$ of 278° C. After heat treatment at 260° C. for 10 minutes, the product had a Ci of 33. $T_G$ and $T_m$ were measured with a differential scanning calorimeter.

(2) A liquid reaction mixture b$_1$ was prepared in the same manner as in (1) and stored. The average degree of polymerization of the p-phenylene sulfide prepolymer in the liquid b$_1$ was 170.

2.2 kg of NMP and 4.0 mol of Na$_2$S.5H$_2$O were charged into a 10-liter polymerization pressure vessel. The temperature was elevated to about 200° C. to distill off water and a small amount of NMP (the amount of water remaining in the vessel: 5.2 mol). A solution comprising 0.7 kg of NMP and 4.1 mol of m-dichlorobenzene was added thereto. Reaction was carried out under heating at 215° C. for 3 hours to obtain a liquid reaction mixture b$_2$. A small amount of the liquid b$_2$ was sampled to determine the degree of polymerization of the resulting m-phenylene sulfide prepolymer by fluorescent X-ray method. The degree of polymerization was 20.

80% of the liquid b$_1$ obtained as described above and 20 mol of water were charged into a 20-liter polymerization pressure vessel. Reaction was carried out under heating at 255° C. for 4 hours. After completion of the reaction, a polymer B [p-phenylene sulfide block copolymer having an average degree of polymerization of

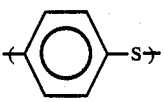

block of 180] was obtained. The polymer B comprised 88 molar % of the

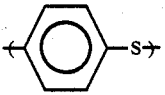

units and 12 molar % of the

units. The product had an $\Delta\eta^*$ of 580 P, $T_G$ of 77° C., Tm of 280° C. and Ci of 35.

(3) 11.0 kg of NMP and 10.0 mol of Na$_2$S.5H$_2$O were charged into a 20-liter polymerization pressure vessel.

The mixture was heated to about 200° C. to distill off water and a small amount of NMP (the amount of water remaining in the vessel: 13 mol). 3.0 kg of NMP, 10.0 mol of m-dichlorobenzene and 0.10 mol of 1,3,5-trichlorobenzene were added thereto, and reaction was carried out at 210° C. for 10 hours. 47 mol of water was added thereto, and the reaction was carried out at 260° C. for 12 hours. After completion of the reaction, a polymer C (m-phenylene sulfide homopolymer) having a η* of about 20 P was obtained.

(4) 11.0 kg of NMP and 20.0 mol of Na$_2$S.5H$_2$O were charged into a 20-liter pressure vessel. The mixture was heated to about 200° C. to distill off water and a small amount of NMP (the amount of water remaining in the vessel: 26 mol). 3.0 kg of NMP, 20.2 mol of p-dichlorobenzene and 54 mol of water were added thereto, and the mixture was heated at 260° C. for 3 hours to carry out reaction.

After completion of the reaction, a polymer D (p-phenylene sulfide homopolymer) was obtained in the same manner as in (1). η* was 610 P.

Molding Example C

Each of the phenylene sulfide polymers was mixed homogeneously with a specific amount of an inorganic filler and a specific amount of an additive in a Henschel mixer. The mixture was shaped into pellets by extruding with a 30 mm φ unidirectional twin screw extruder at a cylinder temperature of 290° to 330° C. The pellets were injection-molded in a mold having a transistor vacant frame inserted therein with an injection-molding machine at a cylinder temperature of 300° to 340° C. and mold temperature of 120° to 180° C. under an injection pressure of 20 to 60 kg/cm$^2$. The sealed products were boiled in a red ink for 24 hours, and penetration of the ink through cracks in the sealing resin or through interfaces between the sealing resin and the frame was examined. The results are shown in Table C-1.

What is claimed is:

1. A printed circuit board comprising an insulating base board made of a composite of 50 to 95 vol. % of a polymer comprising mainly a phenylene sulfide block copolymer and 5 to 50 vol. % of a fibrous reinforcing material and a metal layer of a circuit pattern formed on the insulating base board, said block copolymer being produced by a process comprising a first step of heating an aprotic polar organic solvent containing a dihaloaromatic compound consisting essentially of a m-dihalobenzene and an alkali metal sulfide to form a reaction liquid (E) containing a m-phenylene sulfide polymer consisting essentially of recurring units (B)

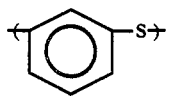

and a second step of adding a p-dihalobenzene to the reaction liquid (E) and heating the mixture in the presence of an alkali metal sulfide and an aprotic polar organic solvent to form a block copolymer consisting essentially of the recurring units (B) and recurring units (A)

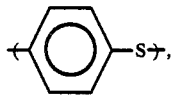

the reaction in the first step being carried out until the average degree of polymerization of at least 2 and in the range of

TABLE C1

| Example No. | C1 | C2 | C3 | C4 | C5 | Comp. Exam. C |
|---|---|---|---|---|---|---|
| Block copolymer | A 40 parts | B 40 parts | A 25 parts B 25 parts | A 40 parts C 10 parts | A 45 parts D 5 parts | D 40 parts |
| Other synthetic resin | | | | (*5) 5 parts | | |
| Inorganic filler (fibrous) | | | (*2) 10 parts (*3) 10 parts | (*6) 15 parts | (*6) 15 parts | |
| Inorganic filler (non-fibrous) | (*6) 60 parts | (*1) 60 parts | (*1) 29 parts | (*7) 25 parts (*8) 4 parts | (*7) 33 parts | (*1) 60 parts |
| Additive | | | (*4) 1 part | (*9) 1 part | (*4) 1 part (*10) 1 part | |
| Depth of penetration of red ink (*9) | 1 | 1 | 1 | 2 | 2 | 5 |

(*1) silica glass powder: QG-100; a product of Toshiba Ceramic Co., 150 Me**-passed,
(*2) wollastonite: NYAD G; a product of NYCO Co., 60 Me-passed,
(*3) potassium titanate fibers: TISMO D; a product of Otsuka Kagaku Yakuhin Co., Japan: 60 Me-passed,
(*4) silane: Z 6040; a product of Dow-Corning Co.,
(*5) epoxy resin: Epikote TM 1009; a product of Shell Petroleum Co.,
(*6) glass fibers: PF-A001, a product of Nittobo Co. (48-100 Me),
(*7) glass beads: CP-2, a product of Toshiba Palodini Co., Japan: 150 Me-passed,
(*8) mica: A 41; a product of Tsuchiya Kaolin Co., Japan: (0.05 mm),
(*9) titanate: Kr-134S, a product of Kenrich Petrochemicals Co.,
(*10) modified silicone oil: SF 8411; a product of Toray Silicon Co., Japan.
(*11) Depth of penetration of red ink: 1: no penetration, 2: substantially no penetration, 3: a little, 4: penetration, 5: remarkable.
**48Me: opening 0.297 mm, 60Me: opening 0.250 mm, 100Me: 0.149 mm, 150Me: 0.105 mm.

$$\left(20 \times \frac{1-X}{X}\right) \text{ to } \left(5{,}000 \times \frac{1-X}{X}\right)$$

wherein X represents a mol fraction of the recurring units (A) in the resulting block copolymer which is in the range of 0.50 to 0.98 has been obtained; the reaction in the second step being carried out until the mol fraction (X) of the recurring units (A) in the resulting block copolymer has become 0.50 to 0.98; and the reactions in these steps being carried out so that the resulting p-phenylene sulfide block copolymer will have a melt viscosity ($\eta^*$) measured under conditions of 310° C./200 sec$^{-1}$ of 300 to 50,000 poise and have:

(a) a glass transition temperature (Tg) of 20° to 80° C.,
(b) a crystalline melting point (Tm) of 200° to 350° C., and
(c) a crystallization index (Ci) of 15 to 45, this value being that of the heat-treated, but not stretch-oriented copolymer.

2. The printed circuit board according to claim 1 wherein the p-dihalobenzene is p-dichlorobenzene and the m-dihalobenzene is m-dichlorobenzene.

3. The printed circuit board according to claim 1 wherein the alkali metal sulfide is sodium sulfide.

4. The printed circuit board according to claim 1 wherein the aprotic polar solvent is an organic amide.

5. The printed circuit board according to claim 4 wherein the amide is N-methylpyrrolidone.

6. A printed circuit board comprising an insulating base board made of a composite of 50 to 95 vol. % of a polymer mainly comprising a phenylene sulfide block copolymer and 5 to 50 vol. % of a fibrous reinforcing material and a metal layer of a circuit pattern formed on the insulating base board, said block copolymer being produced by a process which comprises a first step of heating an aprotic polar organic solvent containing a p-dihalobenzene and an alkali metal sulfide to form a reaction liquid (C) containing a p-phenylene sulfide polymer of recurring units (A)

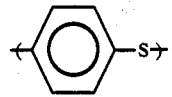

and a second step of adding a dihaloaromatic compound consisting essentially of a m-dihalobenzene to the reaction liquid (C) and heating the mixture in the presence of an alkali metal sulfide and an aprotic polar organic solvent to form a block copolymer consisting essentially of a block consisting essentially of recurring units (A) and a block consisting essentially of recurring units (B)

the reaction in the first step being carried out until the degree of polymerization of the recurring units (A) has become 20 to 5,000 of (A) on the average; the reaction in the second step being carried out until the mol fraction (X) of the recurring units (A) in the resulting block copolymer has become 0.50 to 0.98; and the reactions in these steps being carried out so that the resulting p-phenylene sulfide block copolymer will have a melt viscosity ($\eta^*$) measured under conditions of 310° C./200 sec$^{-1}$ of 300 to 50,000 poise and have:

(a) a glass transition temperature (Tg) of 20° to 80° C.,
(b) a crystalline melting point (Tm) of 200° to 350° C., and
(c) a crystallization index (Ci) of 15 to 45, this value being that of the heat-treated, but not stretch-oriented copolymer.

7. The printed circuit board according to claim 6 wherein the p-dihalobenzene is p-dichlorobenzene and the m-dihalobenzene is m-dichlorobenzene.

8. The printed circuit board according to claim 6 wherein the alkali metal sulfide is sodium sulfide.

9. The printed circuit board according to claim 6 wherein the aprotic polar solvent is an organic amide.

* * * * *